United States Patent
Chiu et al.

(10) Patent No.: US 7,064,085 B2
(45) Date of Patent: Jun. 20, 2006

(54) FEED FORWARD SPACER WIDTH CONTROL IN SEMICONDUCTOR MANUFACTURING

(75) Inventors: Yih-Song Chiu, Tainan (TW); Wen-Ting Tsai, Hsin-chu (TW); Jao-Sheng Huang, Hsin-chu (JP); Chen-Hsiang Leu, Hsin-chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/895,509

(22) Filed: Jul. 20, 2004

(65) Prior Publication Data

US 2006/0019479 A1    Jan. 26, 2006

(51) Int. Cl.
*H01L 21/31* (2006.01)
*H01L 21/469* (2006.01)

(52) U.S. Cl. .................. 438/775; 438/184; 438/230

(58) Field of Classification Search ............... 438/775, 438/184, 230, 706, 733, 745, 734, 756, 757
See application file for complete search history.

(56) References Cited

U.S. PATENT DOCUMENTS 6,005,272 A * 12/1999 Gardner et al. ............. 257/344
6,323,519 B1 * 11/2001 Gardner et al. ............. 257/336
6,551,887 B1    4/2003 Kwon et al.

FOREIGN PATENT DOCUMENTS

WO    PCT/JP95/00592    3/1995

* cited by examiner

*Primary Examiner*—David Nhu
(74) *Attorney, Agent, or Firm*—Duane Morris LLP

(57) ABSTRACT

A feed-forward method and apparatus for controlling spacer width measures spacer width during processing then further processes the spacers in a spacer width adjustment operation to achieve a desired final spacer width. Silicon nitride spacers may be measured after plasma etching and the measured spacer width is automatically compared to the final desired spacer width and a time for further processing is calculated based on a correlation between processing time and spacer width loss. Using computer interface manufacturing, the measured spacer width data is provided to a computer that performs the calculation and provides the further processing time or a recipe to the tool used for the spacer width adjustment operation. The spacer width adjustment operation may be wet processing in an SPM solution that oxidizes the spacers and an HF clean operation may be used to remove the oxidized portion and yield spacer widths within acceptable specification limits.

20 Claims, 3 Drawing Sheets

US 7,064,085 B2

FEED FORWARD SPACER WIDTH CONTROL IN SEMICONDUCTOR MANUFACTURING

FIELD OF THE INVENTION

The present invention relates, most generally, to the formation of semiconductor devices, and more particularly to an apparatus and methods for the feed-forward control of spacer width.

BACKGROUND

Generally, a semiconductor device includes transistor gates formed on a semiconductor substrate and source/drain regions formed on the semiconductor substrate on opposed sides of the gate. As semiconductor devices become more highly integrated, the size of the transistor gate continues to shrink and the source region becomes closer to the drain region. This proximity produces an undesirable short-channel effect. In order to minimize this short-channel effect, spacers are conventionally formed along the sidewalls of the transistor gates. The presence of the spacers increases the distance between the source and drain regions in a particular transistor and also spaces each of the source and drain regions from the channel because the ion implantation process used to form the source and drain regions in the substrate does not implant dopant impurities through the spacers. The spacer width therefore determines the spacing between the source and drain regions and between the channel and each of the source/drain regions. Many functional device characteristics and parameters such as the transistor saturation current, $I_{sat}$, are highly dependent upon the spatial arrangement of the source, drain and channel, and therefore the spacer width. It is therefore important to accurately produce spacers having desired widths. This becomes even more important when device sizes are scaled down and the associated spacers have correspondingly reduced widths.

Spacers are conventionally produced by forming at least one dielectric film over a transistor gate then performing an anisotropic dry etch to form spacers along the vertical sidewalls of the transistor gates. A growing trend is to form spacers from multiple dielectric films formed over the gate structure. Silicon nitride is a commonly favored spacer material. In particular, it has become increasingly popular to form silicon nitride spacers by forming a film stack of an oxide layer over a silicon nitride layer, then etching the film stack to form a composite spacer having portions of the silicon nitride film and the oxide film. A dry etching process is then used to selectively remove the oxide portion of this composite spacer, leaving a silicon nitride spacer having a width that determines the spatial arrangement of the source, drain and channel and therefore various device characteristics and parameters such as the saturation current. It is therefore critical to accurately control the width of such silicon nitride spacers.

It is difficult to control the width of the silicon nitride spacers, however, by controlling the plasma etch processes used to form the silicon nitride spacers, i.e., the etch process used to form the composite spacer, the etch process used to form the final silicon nitride spacer and the various overetch steps, because the plasma etching processes etch very rapidly and use etching times of extremely short duration.

It would therefore be desirable to provide an apparatus and method to accurately produce spacers, particularly silicon nitride spacers, that have desired spacer widths.

SUMMARY OF THE INVENTION

To address these and other needs, and in view of its purposes, the present invention provides a method for spacer width control in a semiconductor device that includes providing a semiconductor device with nitrogen-containing spacers formed along sidewalls of a transistor gate, measuring spacer width of at least one of the nitrogen-containing spacers, calculating a further processing time to reduce the spacer width to a desired final spacer width, and further processing using the calculated further processing time or a time that is about the further processing time, to reduce spacer width. The further processing time is based on measured spacer width, desired spacer width and an available data correlation established for the further processing operation used to adjust the spacer width. The calculating may be done by a computer and computer interface manufacturing methods may be used for feed forward control.

In an exemplary embodiment, the nitrogen-containing spacer is formed of silicon nitride and after the silicon nitride spacer width is measured, the spacer is oxidized using an SPM solution and the oxidized portion is removed by an HF solution to adjust the spacer width.

In another exemplary embodiment, the invention provides a feed-forward apparatus including a computer. The feed-forward apparatus measures spacer width of a nitrogen-containing spacer formed along a sidewall of a transistor gate of a semiconductor device, calculates a further processing time, and provides the further processing time to a system in which a spacer width adjustment processing operation is carried out. In another exemplary embodiment, the apparatus selects a recipe in the system in which the spacer width adjustment processing operation is carried out. The calculation is based on the measured spacer width, desired final spacer width and a previously established data correlation for the spacer width adjustment processing operation.

BRIEF DESCRIPTION OF THE DRAWING

The present invention is best understood from the following detailed description when read in conjunction with the accompanying drawing. It is emphasized that according to common practice, the various features of the drawing are not necessarily to scale. On the contrary, the dimensions of the various features are arbitrarily expanded or reduced for clarity. Like numerals denote like features throughout the specification and drawing. Included in the drawing are the following figures.

DETAILED DESCRIPTION

The invention provides for measuring spacers immediately after formation (and before subsequent processing operations), determining processing time for a spacer width adjustment operation and further processing the spacers in the spacer width adjustment operation, to produce spacers having a desired spacer width.

Figure 1:
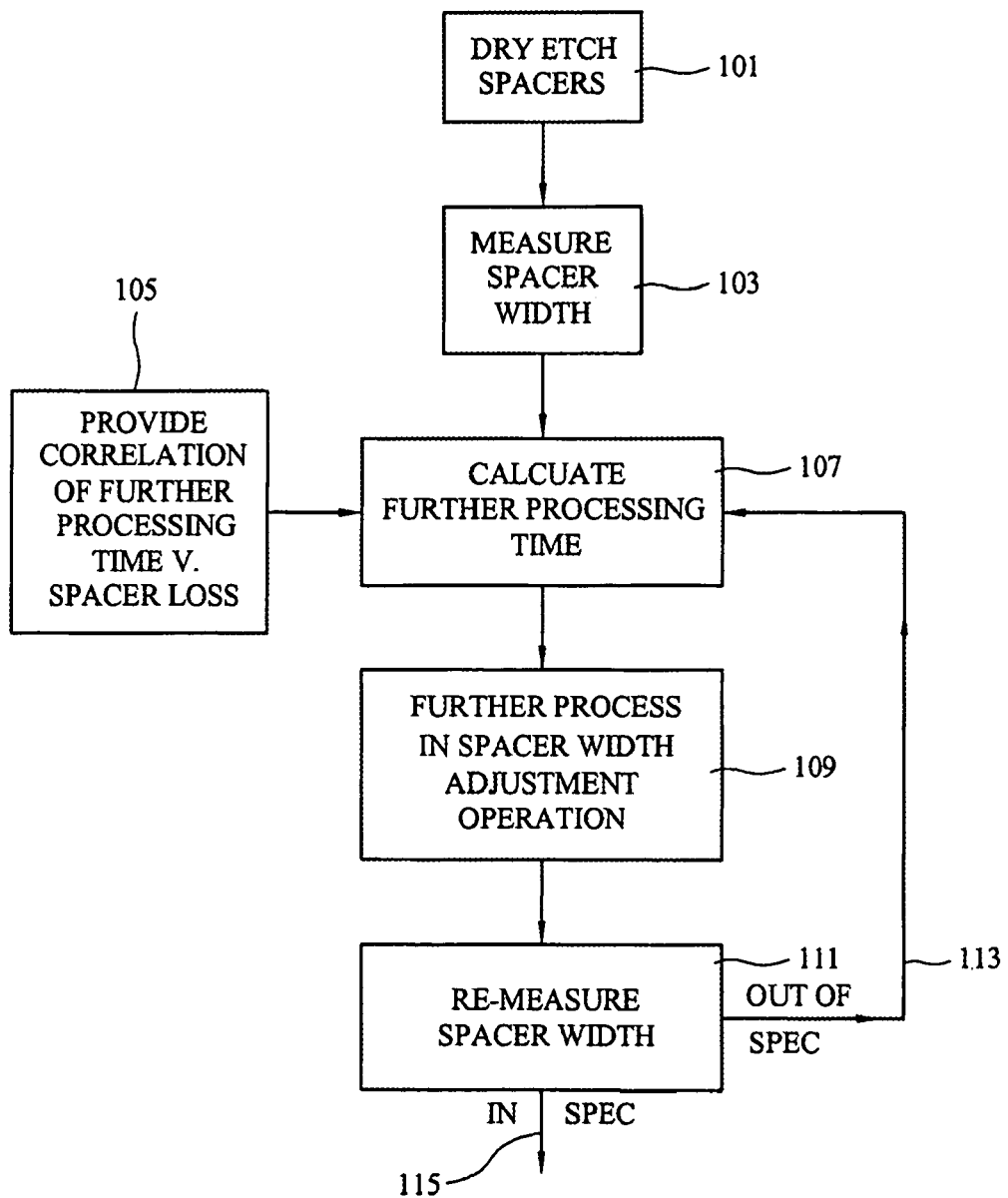
FIG. 1 is a flowchart showing a sequence of operations according to an exemplary method of the present invention.

FIG. 1 is a flowchart that broadly illustrates the method of the present invention. A dry, i.e., plasma etch process or processes are used to form silicon nitride spacers (101) on a semiconductor device, then the width of the dry etched spacer is measured (103). A processing time for further processing the spacers in a spacer width adjustment operation is calculated (107) based on the measured spacer width, the desired final spacer width and a correlation between further processing time and spacer width loss (105) provided to the calculating system. A spacer width adjustment operation is then carried out (109) to reduce spacer width and to desirably produce final spacer widths that are within the acceptable range of specified values. The spacers are then re-measured (111). If the re-measured final spacer width is not within the acceptable range of specified value ("out of spec") (113), a further processing time can be calculated and the spacers further processed in the spacer width adjustment operation (109). If the re-measured spacer width is acceptable (115), the semiconductor devices are passed on to the subsequent processing operation. A computer is advantageously used to calculate further processing time and CIM (computer interface manufacturing) is advantageously used to automatically provide the measured spacer width to the computer and to automatically provide the further processing time to the processing tool in which the spacer width adjustment operation takes place.

Figure 2:
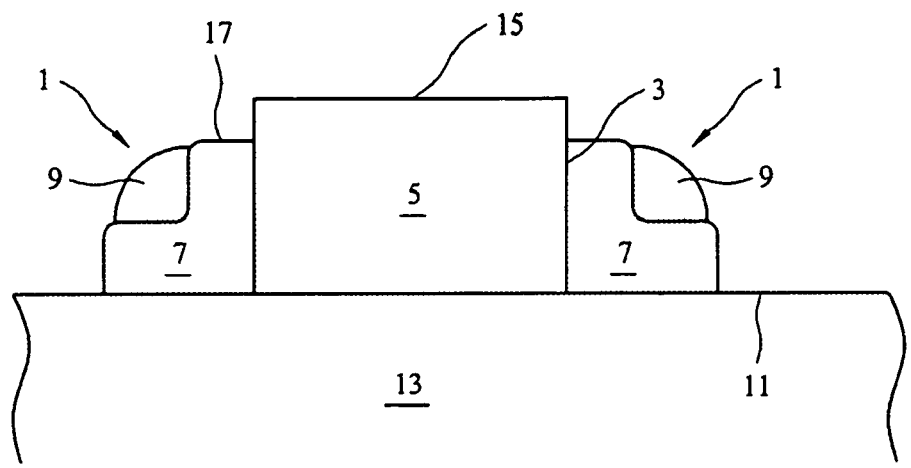
FIG. 2 is a cross-sectional view showing an exemplary composite spacer formed by dry etching.

Various methods may be used to form the spacers that will be adjusted to a desired width according to the feed-forward control of the present invention. In one exemplary embodiment, the spacers are formed using dry etching. FIG. 2 is a cross sectional view of an exemplary embodiment showing spacers 1 formed along respective sidewalls 3 of transistor gate 5 in a semiconductor device. Transistor gate 5 is formed of polysilicon or other suitable materials and is formed over surface 11 of substrate 13 using conventional methods. At this stage, spacers 1 are composite spacers formed of nitrogen-containing spacers 7 and further dielectric 9. In one exemplary embodiment, nitrogen-containing spacers 7 may be silicon nitride spacers but other nitrogen-containing spacers such as silicon oxynitride may be used in other exemplary embodiments. In an exemplary embodiment, further dielectric 9 may be a TEOS layer but other suitable dielectrics may be used in other exemplary embodiments. Spacers 1 include top surface 17 which is receded below top surface 15 of transistor gate 5 in the illustrated embodiment but may be level with top surface 15 in other exemplary embodiments. Spacers 1 may be formed by dry, plasma etching and in one exemplary embodiment, a substantially continuous film of a nitrogen-containing film such as silicon nitride may be formed over transistor gate 5 and a film of further dielectric may be formed over the silicon nitride film. A sequence of anisotropic plasma etching operations may be used to form spacers 1 from the films, i.e., portions of the films remain along sidewalls 3 of transistor gate 5 to form nitrogen-containing spacers 7 and further dielectric 9 after the etching operations are concluded. The sequence of plasma etching operations may include one or more overetch processes.

Figure 3:
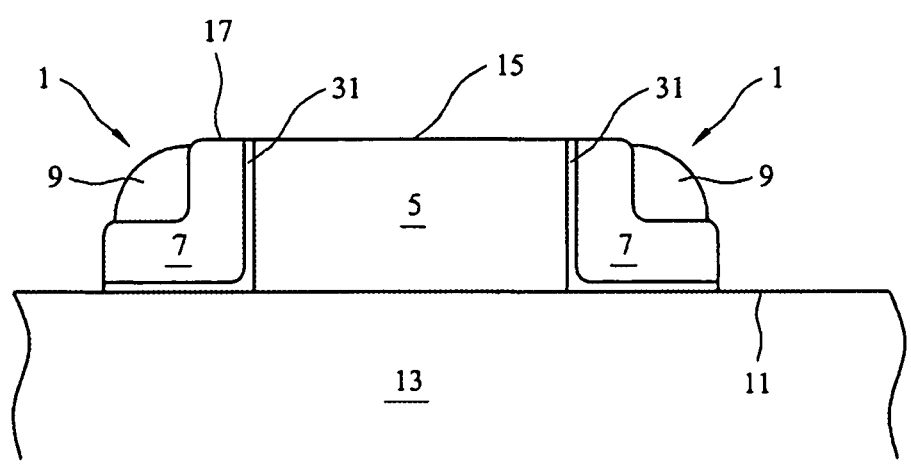
FIG. 3 is a cross-sectional view showing another exemplary composite spacer formed by dry etching

In another exemplary embodiment shown in FIG. 3, oxide spacers 31 may be disposed between sidewalls 3 and nitrogen-containing spacers 7. Conventional materials and methods may be used. In one exemplary embodiment, oxide spacers 31 may be formed of TEOS.

Figure 4:
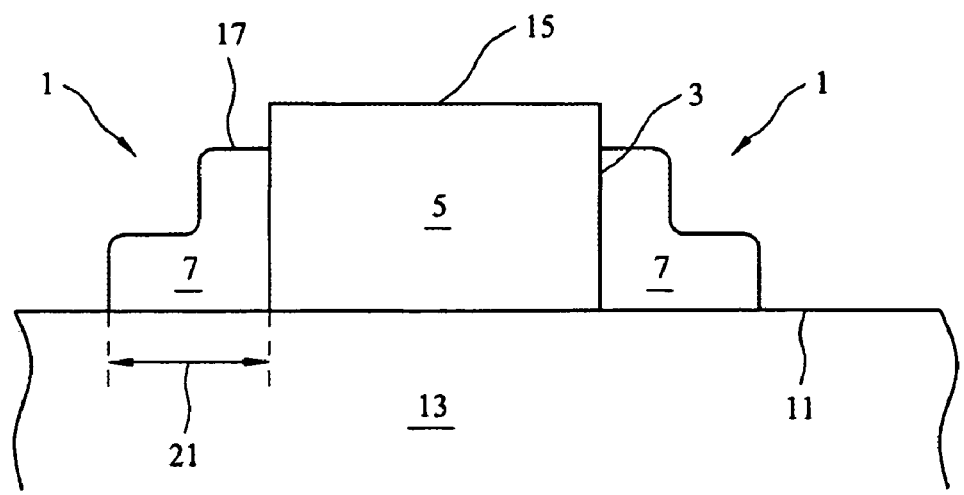
FIG. 4 is a cross-sectional view showing an exemplary silicon nitride spacer formed by dry etching.

Returning to the exemplary structure shown in FIG. 2, a selective plasma etching operation is then performed to remove further dielectric 9 and produce the structure illustrated in FIG. 4 in which spacer 1 consists of nitrogen-containing spacer 7 and is generally "L"-shaped. The "L"-shaped configuration of nitrogen-containing spacer 7 is intended to be exemplary only and in another exemplary embodiment, in particular where only silicon nitride and no further dielectric 9 is used, spacer 1 may have a different shape. For example, the nitrogen-containing spacer may have the rounded shape of composite spacer 1 shown in FIG. 2. In other exemplary embodiments, various other film stacks and sequences of plasma etching operations may be used to yield silicon nitride spacers of various other shapes.

Nitrogen-containing spacer 7 includes spacer width 21 and FIG. 4 illustrates the stage at which the initial spacer width 21 is measured. Various metrology tools may be used to measure spacer width 21. For example, a CD-SEM (critical dimension Scanning Electron Microscope) such as manufactured by Hitachi or KLA, may be used, but other measurement systems may be used in other exemplary embodiments. The measured width may be an average of several individual spacer widths measured. Product and/or test substrates may be used for measurement. The measured width is then compared to a final desired spacer width and a further processing time is calculated that is specific to the spacer width adjustment operation that will be used to further process the substrates and adjust the spacer width. In an exemplary embodiment, the calculating system may be a computer and CIM (Computer Interface Manufacturing) techniques may be used to automatically provide the measured spacer width to the computer. The further processing time is then fed forward, either manually or automatically using CIM, to the further processing tool in which the spacer width adjustment processing operation takes place. Other calculating systems and techniques may be used in other exemplary embodiments. The further processing time may be a numerical time value that is inputted directly to the spacer width adjustment processing tool such that the operation in carried out for exactly the calculated time. Alternatively, the spacer width adjustment processing operation may take place in a tool that includes a number of pre-programmed recipes with fixed times and the automated calculation of further processing time may determine the selection, through CIM or other techniques, of the recipe having a pre-programmed time that is closest to the calculated time.

The calculation will preferably rely upon a correlation previously established between processing time in the spacer width adjustment operation and spacer width loss, to arrive at the further processing time. In an exemplary embodiment, the correlation data is previously established from a series of test trials performed on the spacer width adjustment processing operation to establish spacer width loss as a function of time. In another exemplary embodiment, computer modeling may be used. The correlation data is provided to and stored within the calculating system.

In one exemplary embodiment, the further processing operation may be contacting the substrate surface, including the spacers, to an SPM solution which is an $H_2O_2/H_2SO_4$ etching/cleaning solution. SPM is known to be an oxidizing medium that oxidizes silicon nitride, for example. In this exemplary embodiment, the further processing time is the time that the substrate contacts the SPM solution. In one exemplary embodiment, the substrate is immersed in an SPM bath and the further processing time is dipping time. In other exemplary embodiments, automated spin-processing or cascading wet tools may be used to contact the substrate surface with the SPM solution or immerse the substrate partially or wholly within a static or dynamic SPM solution. In an exemplary embodiment, the SPM solution may be a 4:1 SPM solution maintained at a temperature of 130+/−5° C., but other conditions may be used in other embodiments. During exposure to SPM, the silicon nitride of the silicon nitride spacer is oxidized to form an oxidized portion and the oxidation takes place at the expense of silicon nitride according to the embodiment in which the nitrogen-containing material is silicon nitride. As such, the un-oxidized portion of the silicon nitride spacer is reduced. After SPM processing, the substrate is then contacted to a dilute hydrofluoric acid (HF) solution that selectively removes the oxidized portion of the silicon nitride spacer thereby reducing the spacer width to that of the un-oxidized portion of the silicon nitride spacer. In one exemplary embodiment, a 60 second dip in 50:1 dilute HF may be used but other times and other concentrations may be used in other exemplary embodiments. The wet HF processing also cleans the substrate so a separate cleaning operation is not needed. Since HF effectively and selectively removes oxidized portions of silicon nitride and does not remove unoxidized silicon nitride, the processing time of this operation is not especially critical. After each of the SPM and dilute HF processing operations, the substrates may be rinsed and dried before proceeding to re-measure. Various QDR's (quick dump rinsers) and HQDR's (heated quick dump rinsers) may be used.

In this SPM/dilute HF exemplary embodiment, the data correlation used to calculate the time for the spacer width adjustment operation may be a trim rate, that is, the amount of spacer width loss as a function of time in the SPM solution. In other exemplary spacer width adjustment processing operations, other trim rates are established.

Spacer width is reduced in the spacer width adjustment processing operation carried out for the calculated further processing time or for a time that is about the calculated further processing time. In an exemplary embodiment, spacer width is reduced to the desired final spacer width. The desired final spacer width is typically provided in a specification which includes an acceptable range of values. As such, the desired final spacer width may be considered to be any value within the acceptable specification range.

Figure 5:
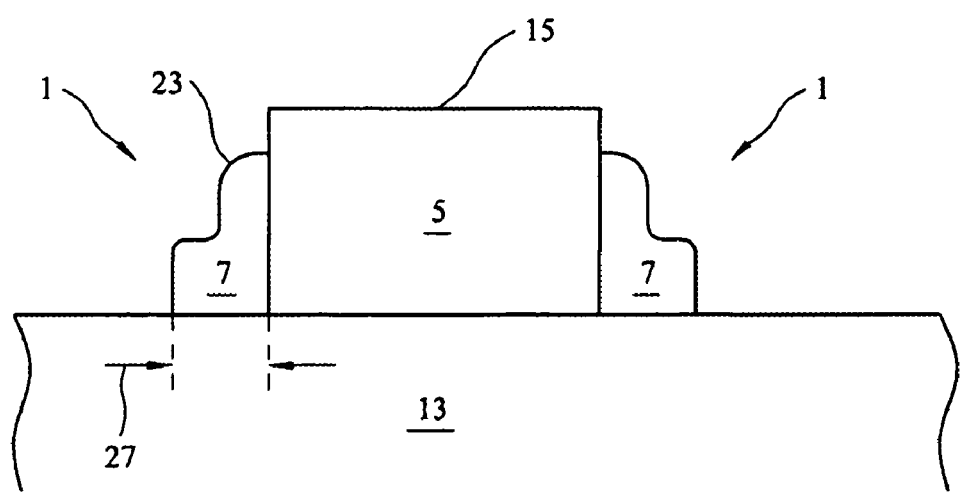
FIG. 5 is a cross-sectional view showing the structure in FIG. 4 after a spacer width adjustment operation has been used to reduce the width of the silicon nitride spacer to approximate the desired spacer width.

After the spacer width adjustment processing operation is carried out and the spacer width is reduced as shown in FIG. 5, spacer width 27 is then measured using any of the aforementioned metrology tools. In a preferred embodiment, the same measurement tool will be used to measure both spacer width 21 taken before further processing and spacer width 27 measured after the spacer width adjustment operation. In an exemplary embodiment, the same spacer will be measured. If measured spacer width 27 taken after the spacer width adjustment operation is within the specified range of acceptable values, the substrate is then passed on to the subsequent processing operation. If the measured spacer width 27 is not within the specified acceptable range, a further processing time may again be calculated and the devices further processed in the SPM/dilute HF processing operations to further reduce spacer width until the width is within the specified range of acceptable values. This is illustrated by the "out of spec" alternative 113 shown in FIG. 1.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. For example, while the feed-forward method for calculating a further processing time and further processing the spacers for the calculated processing time has been described in conjunction with an SPM operation, the principles of the present invention can be similarly applied to other subsequent processing operations that reduce spacer width. Moreover, either or all of the following steps may be carried out manually: inputting the measured spacer width data to a calculating device; calculating the further processing time; providing the data correlation to the calculating device and, programming the further processing time or selecting the recipe including the further processing time. Furthermore, the SPM oxidizing principles of silicon nitride also apply when the nitrogen-containing spacers are formed of other materials.

Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical,", "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for spacer width control in a semiconductor device, comprising:
   providing a semiconductor device with nitrogen-containing spacers formed along sidewalls of a transistor gate;
   measuring spacer width of at least one of said nitrogen-containing spacers to obtain a measured spacer width;
   calculating a further processing time to reduce said spacer width to a desired final spacer width, said calculating based on said measured spacer width; and
   further processing in a spacer width adjustment operation for one of said further processing time and about said further processing time, to reduce said spacer width.

2. The method as in claim 1, further comprising developing a correlation between processing time and spacer width loss in said spacer width adjustment operation and wherein said calculating is further based on said correlation.

3. The method as in claim 1, wherein said providing a semiconductor device further comprises oxide spacers disposed between said nitrogen-containing spacers and said sidewalls.

4. The method as in claim 1, wherein said further processing produces said spacers having substantially said desired final spacer width.

5. The method as in claim 1, wherein said spacer width adjustment operation comprises contacting an SPM solution and said further processing further includes wet etching in HF after said contacting an SPM solution.

6. The method as in claim 5, further comprising maintaining said SPM solution at a temperature of 130+/−5° C.

7. The method as in claim 5, wherein said calculating comprises determining said further processing time by developing a correlation between spacer width loss and time contacting an SPM solution.

8. The method as in claim 5, wherein said contacting an SPM solution causes said nitrogen-containing spacer to oxidize thereby forming an oxidized portion and wherein said wet etching in HF removes said oxidized portion, said further processing time calculated to oxidize said nitrogen-containing spacer to an extent such that subsequent removal of said oxidized portion produces substantially said desired final spacer width.

9. The method as in claim 1, wherein said nitrogen-containing spacers are silicon nitride spacers.

10. The method as in claim 9, wherein said providing includes providing a transistor gate with sidewalls,
    forming a silicon nitride layer over said transistor gate, and
    etching to form said silicon nitride spacers on said sidewalls.

11. The method as in claim 9, wherein said etching to form said silicon nitride spacers comprises plasma etching.

12. The method as in claim 1, further comprising forming a further dielectric over said silicon nitride layer and wherein said etching to form silicon nitride spacers includes plasma etching said further dielectric to form a composite spacer of said silicon nitride and said further dielectric, then removing said further dielectric to produce said silicon nitride spacers.

13. The method as in claim 1, wherein said further processing in a spacer width adjustment operation is automatically done responsive to said calculating.

14. The method as in claim 1, wherein said calculating is done by a computer and comprises automatically calculating said further processing time and automatically providing said further processing time to a system in which said spacer width adjustment operation occurs.

15. The method as in claim 14, wherein said measuring includes providing said measured spacer width to said computer using computer interface manufacturing techniques.

16. The method as in claim 1, wherein said measuring is done in a scanning electron microscope.

17. The method as in claim 1, further comprising providing instructions to a tool to perform said spacer width adjustment operation.

18. The method as in claim 17, wherein said providing comprises automatically selecting a pre-programmed recipe of said tool.

19. The method as in claim 1, further comprising re-measuring said spacer width following said further processing.

20. A method for spacer width control in a semiconductor device, comprising:
    providing a semiconductor device with nitrogen-containing spacers formed along sidewalls of a transistor gate;
    measuring spacer width of at least one of said nitrogen-containing spacers to obtain a measured spacer width;
    calculating a further processing time to reduce said spacer width to a desired final spacer width, said calculating based on said measured spacer width; and
    further processing by contacting an SPM solution for one of said further processing time and about said further processing time then wet etching in HF, to reduce said spacer width.

* * * * *